(12) United States Patent
Berry et al.

(10) Patent No.: US 7,979,838 B2
(45) Date of Patent: Jul. 12, 2011

(54) METHOD OF AUTOMATING CREATION OF A CLOCK CONTROL DISTRIBUTION NETWORK IN AN INTEGRATED CIRCUIT FLOORPLAN

(75) Inventors: Christopher J. Berry, Hudson, NY (US); Jose Luis Pontes Correia Neves, Poughkeepsie, NY (US); Lawrence David Curley, Round Rock, TX (US); Patrick James Meaney, Poughkeepsie, NY (US); Travis Wellington Pouarz, Austin, TX (US); William J. Scarpero, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 534 days.

(21) Appl. No.: 12/032,517

(22) Filed: Feb. 15, 2008

(65) Prior Publication Data
US 2009/0210843 A1    Aug. 20, 2009

(51) Int. Cl.
*G06F 17/50*    (2006.01)
(52) U.S. Cl. .................................... 716/139; 716/108
(58) Field of Classification Search .................. 716/10, 716/108, 139
See application file for complete search history.

(56) References Cited

U.S. PATENT DOCUMENTS

| | | | |
|---|---|---|---|
| 6,323,714 B1 | 11/2001 | Naffziger et al. | |
| 6,452,435 B1 | 9/2002 | Skergan et al. | |
| 6,711,724 B2 * | 3/2004 | Yoshikawa | 716/6 |
| 6,943,610 B2 | 9/2005 | Saint-Laurent | |
| 7,225,421 B2 | 5/2007 | Migatz et al. | |
| 7,643,591 B2 * | 1/2010 | Arsovski et al. | 375/354 |
| 2004/0083400 A1 | 4/2004 | Saito et al. | |
| 2004/0260960 A1 | 12/2004 | Hilgendorf et al. | |
| 2007/0186204 A1 | 8/2007 | Fredrickson et al. | |
| 2007/0234242 A1 * | 10/2007 | Inui et al. | 716/1 |

* cited by examiner

*Primary Examiner* — Jack Chiang
*Assistant Examiner* — Brandon W Bowers
(74) *Attorney, Agent, or Firm* — William A. Kinnaman, Jr.

(57) ABSTRACT

The process of laying out a floorplan for a clock control distribution network in an integrated chip design is simplified and the efficiency of a staging network created is improved. Rather than manually create the staging network in HDL or as a network description table while looking at a picture of the chip floorplan in a Cadence Viewer, an automated method which runs in the Cadence environment uses an algorithmic approach to the problem of maximizing the utilization of staging latches, eliminating unnecessary power and area usage. Efficiency is maximized by updating the Physical Layout directly with the staging solution arrived at by the algorithm.

12 Claims, 3 Drawing Sheets

METHOD OF AUTOMATING CREATION OF A CLOCK CONTROL DISTRIBUTION NETWORK IN AN INTEGRATED CIRCUIT FLOORPLAN

FIELD AND BACKGROUND OF INVENTION

This invention relates to, and the following discussion assumes skill in, the design of integrated circuit chip floorplan, layout or topography and in particular in the use of electronic design automation tools capable of place and route design.

Multiple giga-hertz frequency integrated circuit designs contain complex distribution networks for clock control logic. From a centralized source circuit, clock control signals are distributed throughout the design through multiple levels of staging latches to support high frequency operation. The number of levels of staging latches is defined by the chip timing architect and can be no more or no less than the exact number of levels defined. Clock control signals must switch at the highest frequency available (usually the Phase Locked Loop—PLL—oscillator frequency itself) to support the start and stop requirements for the system. To meet these difficult timing constraints, staging latches are placed at optimal locations throughout the chip and the clock control signals are distributed through these latches to meet the timing requirements of these clock control signals. Physical abstracts for logic elements exist at various locations throughout the chip floorplan creating obstacles (physical barriers) which these clock control signals must navigate around in order to provide clock controls to all necessary pin destinations throughout the chip. The location of these abstracts will likely be non-symmetrical creating an imbalanced distribution network requirement for these clock control signals as they propagate through the staging network across the chip.

Traditionally the method of creating the staging distribution across the whole chip with staging latches has been a manual process. Determining the distribution network requires knowledge of the location of all abstract blockages which will interfere with the placement of these latches and the routing and connections between them. Physical abstract location information can be found in the "Physical Layout" using a Cadence Viewer program. A designer's expertise is required in understanding what is shown by the Cadence Viewer and visually determining the most appropriate routes around existing abstracts to place latches as close to the required pin connections as possible. Each destination pin connection must contain the same exact number of staging latches between the centralized source circuit and the destination pin to meet the architectural requirements of the design. Writing a complete descriptive of the final routing solution conceived of by the designer required manually writing Hardware Description Language (HDL) which contains the staging latches and all connections from the source in the centralized source circuit to each individual destination sink pin across the whole chip. Creating this HDL is a time consuming and error prone task which requires knowledge of both the logical structure of the chip as well as the physical layout of the chip floorplan. Only an experienced design person would possess these skills. Once the logical description of the latch distribution had been created, additional placement information must also be provided to the chip integrator indicating where each latch in the logical HDL descriptive should be placed. HDL contains no physical placement information. Traditionally physical information is included in HDL by manually adding X, Y coordinates to the latch names in the HDL code. As each generation of chips has grown more complex, the number of staging latches in the distribution network has grown greatly. In the current generation of microprocessor chips the number of staging latches is counted in the thousands and the number of pins requiring these clock control signals is also in the thousands, making the traditional method of completing this work effort almost impossible in a reasonable amount of time.

The most recent generation of microprocessors used several software tools (written in PERL) which created a staging structure in HDL from a table based input file. The table (plat_staging.tbl) was constructed manually by defining in a simple language the structure of the staging latch distribution network which would be created in the HDL. i.e. root staging tree description with all necessary branches to complete the staging network. Fanout was taken into account and appropriate cloning of latches was done where appropriate to support loading and fanout. A second software tool accessed and searched the chip level Physical Layout for appropriate destination sink pins and created a connection file (plat_connection.lst) that defined connections between the latches created in the 1st step and the destination pins requiring a control signal. This file was then applied to the source HDL (via a PERL script) to insert and connect the staging network to all required sink pins in the design (plat_staging.vhdl). Although a significant step forward from the traditional method above, this process was still time consuming and did not create an optimal solution to a complex distribution problem. One inherent problem with this method was the "two pass" requirement. As the design progressed additional destination pins appeared in the design. Initially these pins would not have a physical location associated with them in the Physical Layout. The physical location is assigned by the integrator after creating the Physical Layout. Without physical location information it is impossible to determine the appropriate staging latch to connect to each new destination pin. The solution was to create an initial Physical Layout and define pin locations for all new destination sink pins, then pass the Physical Layout back to the tools to determine the appropriate latch connection for all new pins. Then a second Physical Layout was created with the final staging and pin connection solution. This two pass process was time consuming and was still not efficient because the original table which defined the staging distribution network to be created was itself manually created, requiring manual intervention for every change to the design structure.

SUMMARY OF THE INVENTION

The present invention addresses the problem described above by simplifying and automating the process to improve the efficiency of the staging network created. Rather than manually create the staging network in HDL or as a network description table while looking at a picture of the chip floorplan in a Cadence Viewer, this invention proposes an automated method which runs in the Cadence environment itself. Using an algorithmic approach to the problem maximizes the utilization of the staging latches eliminating unnecessary power and area usage. Efficiency is maximized by updating the Physical Layout directly with the staging solution arrived at by the algorithm. A second portion of the solution eliminates the need to provide an HDL staging descriptive which identically matches the staging solution created in the Physical Layout.

BRIEF DESCRIPTION OF DRAWINGS

Some of the purposes of the invention having been stated, others will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Figure 1:
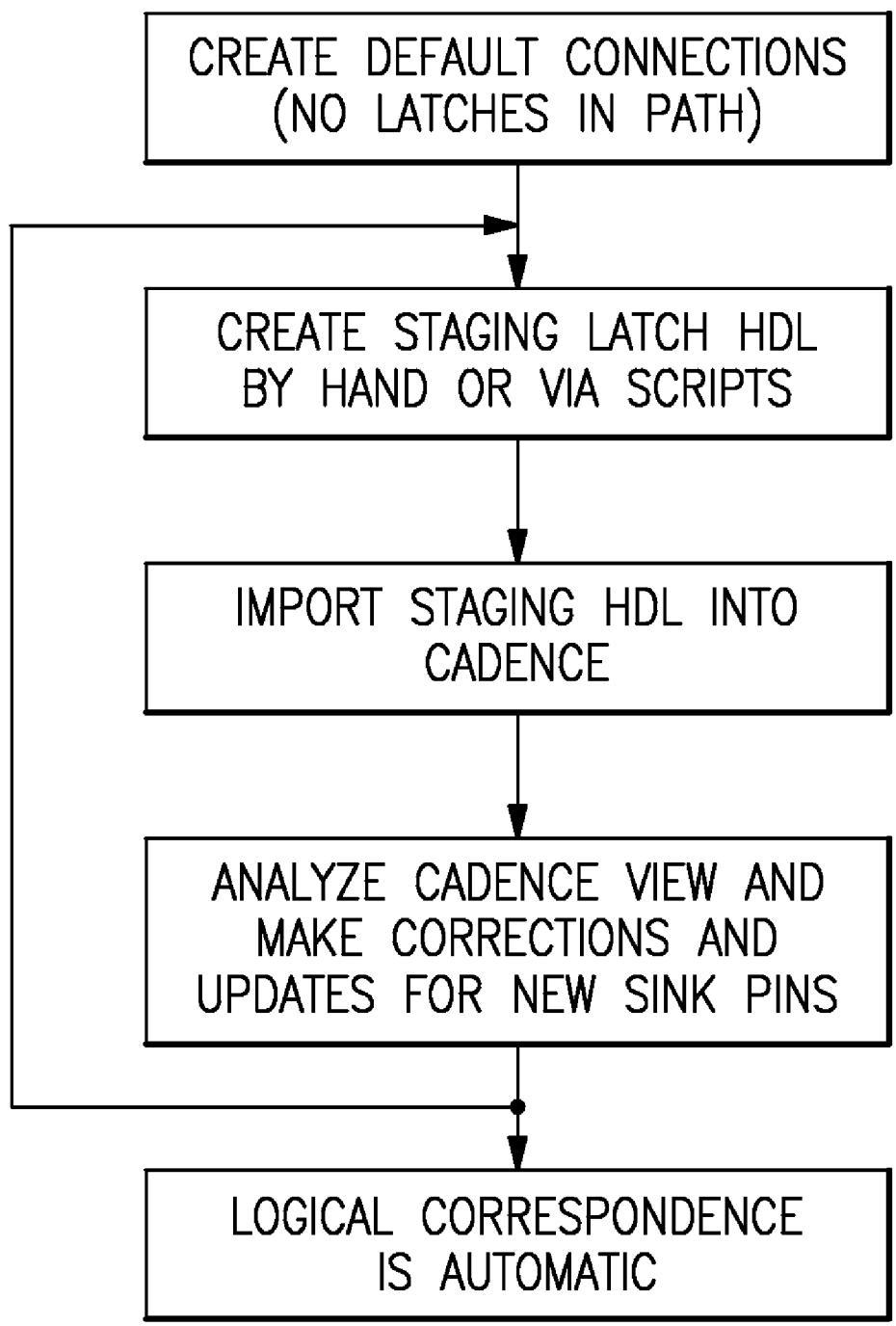
FIG. 1 illustrates a prior art workflow in chip floorplan design.
Figure 2:
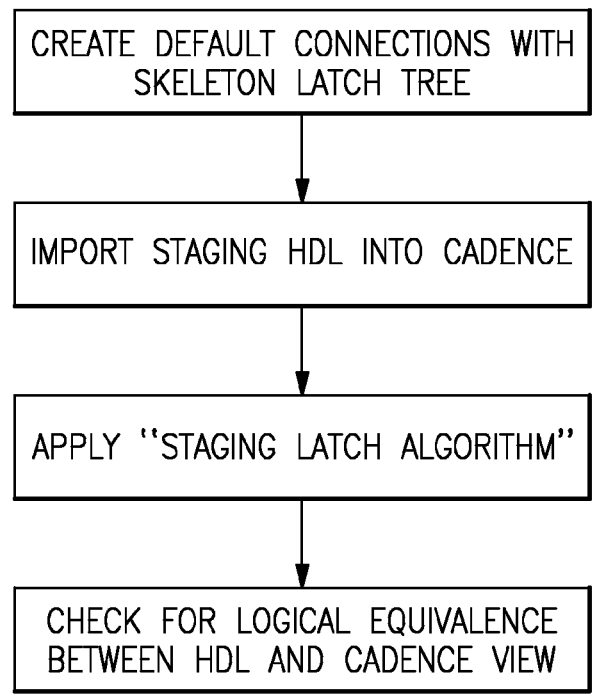
FIG. 2 illustrates the workflow of this invention.

This invention is implemented in several pieces:

A first step is the creation of a "skeleton" latch staging tree in HDL which contains a single string of latches representing the required number of cycle delays defined by the chip timing architect (see FIG. 2). Referring now more particularly to FIG. 2, the steps there illustrated are to create default connections at 10, import the resultant HDL into Cadence (or the selected design software) at 11, apply the staging algorithm described hereinafter with reference to FIG. 3 at 12, and check for logical equivalence at 14. This string of latches daisy chains from one staging latch to the next with no additional fanout. The final staging latch then feeds ALL required sink pins for this clock control signal. No concern for loading (fanout) or timing is considered. Each latch in the skeleton staging tree requires a special attribute to be applied which designates the latch as a skeleton staging latch which will be cloned in Cadence (or the selected design software) once the HDL is loaded into the Cadence database. The attribute will be detected by a new algorithm called a "staging latch cloning algorithm" (see FIG. 3) and recognized as a latch that is part of a staging tree which must be expanded and copied to meet the distribution needs for loading and timing in the final design. The method of creating this staging tree in HDL is trivial, is not part of this invention, and can be left to the discretion of the designer.

A second step is the creation of a Physical Layout from HDL which incorporates this skeleton staging tree. The HDL is imported into the Cadence design system in the normal fashion (step 11 in FIG. 2). Once the Physical Layout is loaded into the Cadence design database, a "Staging Latch Cloning Algorithm" (FIG. 3) is applied which analyzes the floorplan of the chip, including all obstacles and blockages which would affect the placement and routing of the fully structured clock control staging network. The algorithm works backwards from the set of destination pins receiving a clock control signal from a skeleton staging latch tree and for each clock control signal containing the appropriate attributes from the HDL constructs an optimal staging network personalized to meet the timing and fanout requirements of that individual staged clock control signal. The algorithm updates the Physical Layout with the new staging latch network. The resultant staging distribution network is a network optimized for destination pin location as well as required fanout. No unnecessary latches are used. The algorithm applies the same attribute that was carried in from the original latch in HDL to every copy of that latch created in the Physical Layout. These attributes provide a "correspondence" between the original skeleton latches in the HDL and the newly created staging network created by the staging latch cloning algorithm in Cadence.

Figure 3:
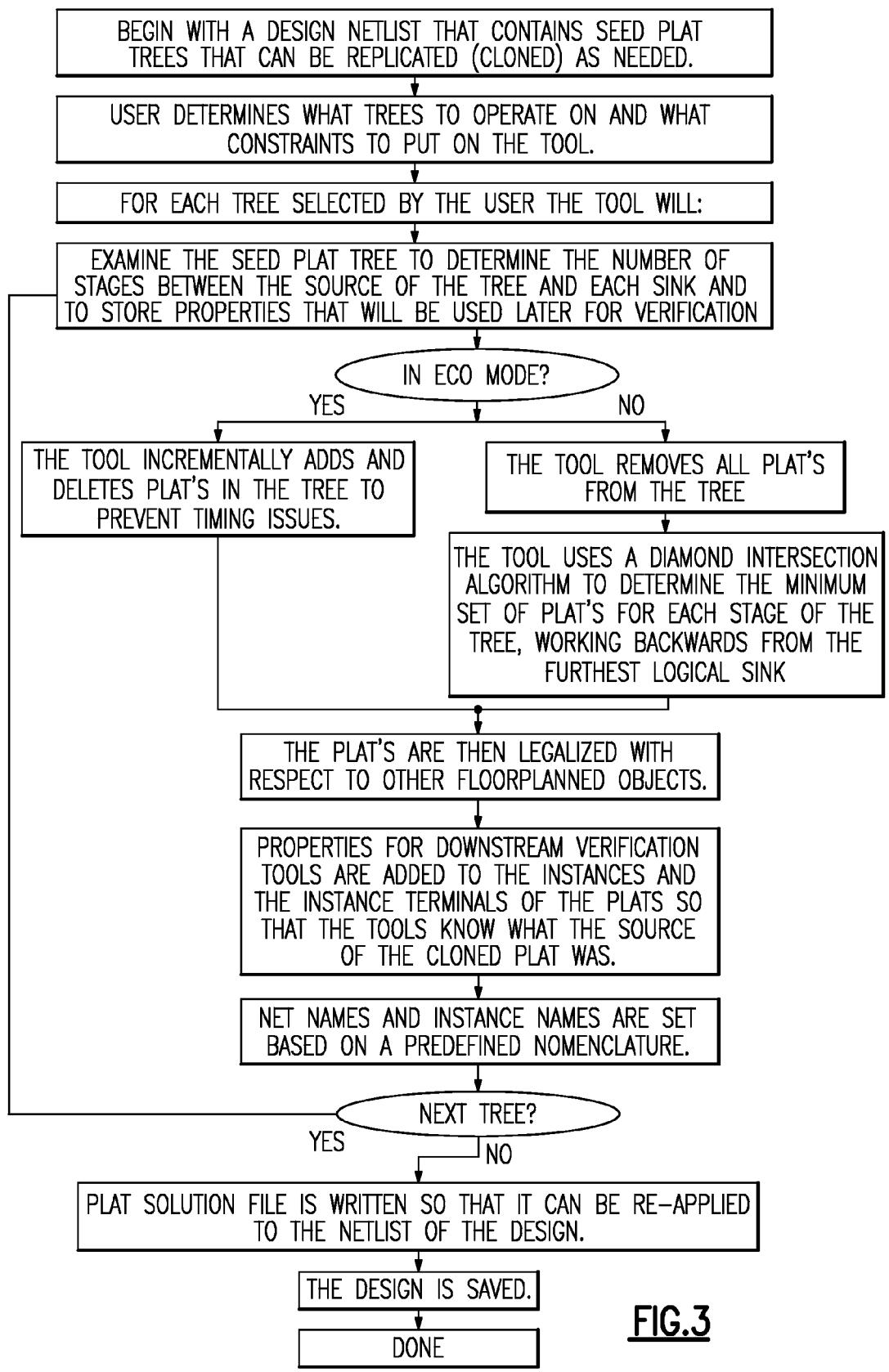
FIG. 3 illustrates the workflow of the staging latch algorithm referenced in FIG. 2.

Referring now more particularly to FIG. 3, the staging latch cloning algorithm begins with a design netlist containing seed plat trees that can be replicated as needed, at 20. A user determines the tree on which to operate (at 21) and the constraints to impose on the tool. Thereafter, for each tree selected by the user (at 22), the tool will examine the seed plat tree to determine the number of stages between the source of the tree and each sink (at 23) and store properties to be used later for verification. A decision point is then reached at 24 for a determination of whether the process is in Engineering Change Order (ECO) mode. If yes, then the tool incrementally adds and deletes plats in the tree to prevent timing issues (at 25). If no, the tool removes all plats from the tree (at 26) and then uses a diamond intersection algorithm (see FIG. 4 and the discussion which follows) to determine the minimum set of plats for each stage of the tree, working backward from the furthest logical sink (at 28). The plats are then legalized with respect to other floorplanned objects at 29, properties for downstream verification are added at 30, and nt names and instance names are set at 31. The algorithm is then prepared for a decision point 32 between looping back for a next tree or writing a plat solution file at 33, saving of the design at 34, and ending at 35.

What next follows is final logical equivalence checking between the Physical Layout and the source HDL. Normal design processing requires all logic in the Physical Layout to have corresponding logic in the HDL for the logic equivalence tool to return a passing grade. However, the result of running the staging latch cloning algorithm on the Physical Layout will by definition provide a different Physical Layout latch structure than was provided in the source HDL which contained the skeleton staging structure. Normal processing of the Physical Layout and the HDL by the logical equivalence tool would return a failing grade in this scenario. To avoid this failing grade and ensure that the result of the staging latch cloning algorithm is logically equivalent to the skeleton latches, the logical equivalence tool is modified to recognize the attribute that was first applied to the latches within the skeleton staging tree. The logical equivalence tool searches the Physical Layout for identical attributes and, once found, will equate all cloned latches in the Physical Layout which have a common attribute with the skeleton latch in the HDL containing the same attribute. The tool will check to ensure that all cloned latches in the Physical Layout have logically equivalent sources and sinks to guarantee functional equivalence between the HDL and the Physical Layout. This is a huge reduction in work to not require that the source HDL identically match the Physical Layout. There is no need to modify the HDL based on any resultant changes made in the Physical Layout. This eliminates a major work item in the previous method above.

Figure 4:
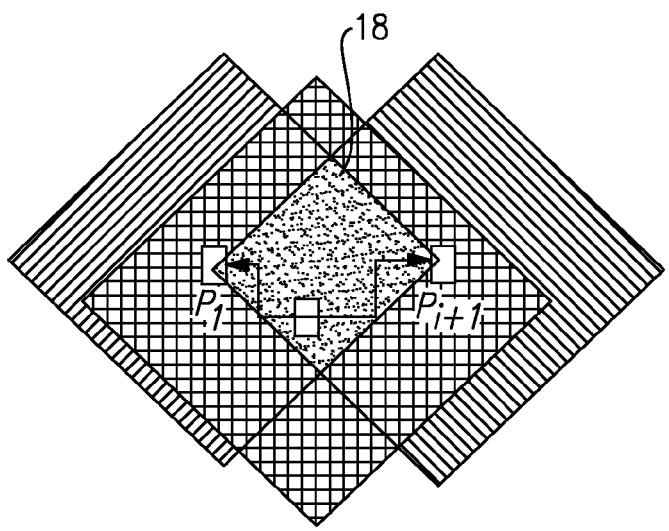
FIG. 4 illustrates a diamond intersection algorithm used at one step in the workflow of FIG. 3.

It is noted that the staging latch tree algorithm uses, at one point in the process (step 28 in FIG. 3), a diamond intersection algorithm to determine the minimum set of plats for each stage of the tree. FIG. 4 shows the operation of such an algorithm. To meet timing constraints, any position must share the intersection of two or three diamonds, depending on the connection of $Point_i$ to $Point_{i+1}$. A first diamond is centered on $Point_i$. Another diamond is centered on $Point_{i-1}$. A third diamond is centered on an intermediate point. The intersection area 18 in FIG. 4 is the area where a point can be positioned without violating the timing constraints between its connecting plats in a two-dimensional space. This box is determined by the recursive intersection of diamonds using an area intersection algorithm. The outcome is a parallelogram.

Figure 5:
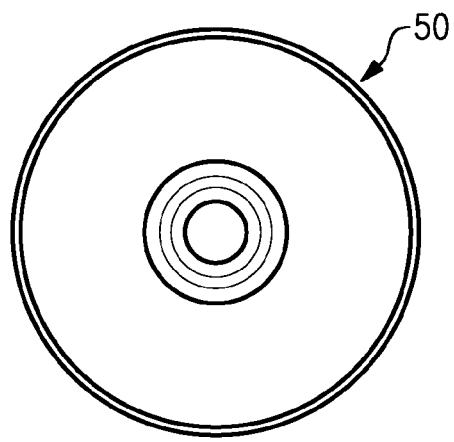
FIG. 5 shows a computer readable medium in accordance with certain characteristics of this invention.

As one example, one or more aspects of the present invention can be included in an article of manufacture (e.g., one or more computer program products) having, for instance, computer usable media, indicated at 50 in FIG. 5. The media has embodied therein, for instance, computer readable program code means for providing and facilitating the capabilities of the present invention. The article of manufacture can be included as a part of a computer system or sold separately. Machine readable storage mediums may include fixed hard drives, optical discs, magnetic tapes, semiconductor memories such as read only memories (ROMs), programmable memories (PROMs of various types), flash memory, etc. The article containing this computer readable code is utilized by executing the code directly from the storage device, or by copying the code from one storage device to another storage device, or by transmitting the code on a network for remote execution.

In the drawings and specifications there has been set forth a preferred embodiment of the invention and, although specific terms are used, the description thus given uses terminology in a generic and descriptive sense only and not for purposes of limitation.

What is claimed is:

1. A method of facilitating design of integrated circuits by:
   executing on a processor of a computer system integrated circuit design program code, the method comprising:
   creating a skeleton tree of latch position plats for clock control circuit distribution on a integrated circuit floorplan;
   importing the created skeleton tree into a chip layout design software tool;
   determining the number of stages between the source of the tree and each sink; and
   adjusting the number of plats to control timing issues by:
   determining that the chip design layout software tool is operating in Engineering Change Order (ECO) mode; and then
   incrementally adding and deleting plats in the tree to control timing issues and determining the number of plats in the tree.

2. A method of facilitating design of integrated circuits according to claim 1 further comprising legalizing the determined number of plats in the tree with respect to other floorplanned objects.

3. A method of facilitating design of integrated circuits according to claim 2 further comprising adding to the identification of plats attributes identifying the plats to downstream design verification software tools.

4. A method of facilitating design of integrated circuits by:
   executing on a processor of a computer system integrated circuit design program code, the method comprising:
   creating a skeleton tree of latch position plats for clock control circuit distribution on a integrated circuit floorplan;
   importing the created skeleton tree into a chip layout design software tool;
   determining the number of stages between the source of the tree and each sink; and
   adjusting the number of plats to control timing issues by:
   determining that the chip design layout software tool is not operating in Engineering Change Order (ECO) mode; and then
   removing all plats in the tree and performing a diamond intersection analysis and determining the minimum number of plats for each stage of the tree to control timing issues.

5. A method of facilitating design of integrated circuits according to claim 4 further comprising legalizing the determined number of plats in the tree with respect to other floorplanned objects.

6. A method of facilitating design of integrated circuits according to claim 5 further comprising adding to the identification of plats attributes identifying the plats to downstream design verification software tools.

7. An apparatus which facilitates integrated circuit design comprising:
   a tangible computer readable medium;
   integrated circuit design program code stored on said medium accessibly to a computer system and effective, when executing on the computer system to:
   import a created skeleton tree into a chip layout design software tool;
   determine the number of stages between the source of the tree and each sink;
   determine that the chip design layout software tool is operating in Engineering Change Order (ECO) mode,
   incrementally add and delete plats in the tree to control timing issues;
   determine the number of plats in the tree; and
   write the plat solution.

8. An apparatus which facilitates integrated circuit design according to claim 7 wherein the program code, when executing, legalizes the determined number of plats in the tree with respect to other floorplanned objects.

9. An apparatus which facilitates integrated circuit design according to claim 8 wherein the program code, when executing, adds to the identification of plats attributes identifying the plats to downstream design verification software tools.

10. An apparatus which facilitates integrated circuit design comprising:
    a tangible computer readable medium;
    integrated circuit design program code stored on said medium accessibly to a computer system and effective, when executing on the computer system to:
    import a created skeleton tree into a chip layout design software tool;
    determine the number of stages between the source of the tree and each sink;
    determine that the chip design layout software tool is not operating in Engineering Change Order (ECO) mode;
    remove all plats in the tree and perform a diamond intersection analysis;
    determine the minimum number of plats for each stage of the tree to control timing issues; and
    write the plat solution.

11. An apparatus which facilitates integrated circuit design according to claim 10 wherein the program code, when executing, legalizes the determined number of plats in the tree with respect to other floorplanned objects.

12. An apparatus which facilitates integrated circuit design according to claim 11 wherein the program code, when executing, adds to the identification of plats attributes identifying the plats to downstream design verification software tools.

* * * * *